United States Patent
Swanson et al.

(10) Patent No.: US 10,157,005 B2
(45) Date of Patent: Dec. 18, 2018

(54) UTILIZATION OF NON-VOLATILE RANDOM ACCESS MEMORY FOR INFORMATION STORAGE IN RESPONSE TO ERROR CONDITIONS

(71) Applicant: Intel Corporation, Santa Clara, CA (US)

(72) Inventors: Robert C. Swanson, Olympia, WA (US); Tony S. Baker, University Place, WA (US); Theodros Yigzaw, Sherwood, OR (US); Chris Ackles, Lacy, WA (US); Celeste M. Brown, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 15/282,463

(22) Filed: Sep. 30, 2016

(65) Prior Publication Data

US 2018/0095681 A1    Apr. 5, 2018

(51) Int. Cl.
*G06F 3/06* (2006.01)
*G11C 13/00* (2006.01)

(52) U.S. Cl.
CPC .......... *G06F 3/0619* (2013.01); *G06F 3/0655* (2013.01); *G06F 3/0688* (2013.01); *G11C 13/0004* (2013.01)

(58) Field of Classification Search
CPC .... G06F 3/0688; G06F 3/0619; G06F 3/0655; G11C 13/0004
USPC .......................................................... 711/103
See application file for complete search history.

(56) References Cited

U.S. PATENT DOCUMENTS 9,710,321 B2 *   7/2017  Zhao .................... G06F 11/079
2012/0159238 A1*  6/2012  Wang .................. G06F 11/1417
                                                        714/6.1

OTHER PUBLICATIONS

Intel, "Intel 8 Series/C220 Series Chipset Family Platform Controller Hub (PCH)", May 2014 (822 pages).
Intel, "Intel 5100 Memory Controller Hub Chipset", Jul. 2009 (434 pages).
Kumar et al., "Advanced Reliability for Intel Xeon Processor-based Servers", Mar. 2010, Version 1.0 (12 pages).

(Continued)

*Primary Examiner* — Hua J Song
(74) *Attorney, Agent, or Firm* — Hanley, Flight & Zimmerman, LLC

(57) ABSTRACT

Methods, apparatus, systems and articles of manufacture (e.g., physical storage media) to utilize non-volatile random access memory for information storage in response to error conditions are disclosed. Example methods disclosed herein include accessing, with a power control unit associated with a processor, first information describing available capacities of respective reserved regions of a plurality of non-volatile memory modules, the respective reserved regions of the non-volatile memory modules being separate from respective host-visible regions of the non-volatile memory modules. Disclosed example methods also include configuring, with the power control unit, an information storage architecture based on the first information. Disclosed example methods further include storing, with the power control unit, second information in one or more of the respective reserved regions of the non-volatile memory modules in accordance with the information storage architecture.

25 Claims, 10 Drawing Sheets

(56) References Cited

OTHER PUBLICATIONS

Intel, "Intel Xeon Processor E7 Family: Reliability, Availability, and Serviceability", 2001 (16 pages).
Intel, "Intel Xeon Processor E7 v2 2800/4800/8800 Product Family", vol. 2, Mar. 2014 (504 pages).

* cited by examiner

UTILIZATION OF NON-VOLATILE RANDOM ACCESS MEMORY FOR INFORMATION STORAGE IN RESPONSE TO ERROR CONDITIONS

FIELD OF THE DISCLOSURE

This disclosure relates generally to utilization of non-volatile random access memory and, more particularly, to utilization of non-volatile random access memory for information storage in response to error conditions.

BACKGROUND

Computers, servers and other processor-based systems include error handling features to provide diagnostic information after an error condition occurs. Error handling features support serviceability of the system and can impact the cost of system ownership. For example, the longer it takes to diagnose and correct an error in the field (e.g., by isolating a failed part and replacing it), the more it may cost to use the system. Error handling features also support debug work during system development, which can affect a system's time-to-market. However, many system errors are caused by failures that require a system reset before diagnostics can be performed. After the system reset, information that may be helpful in the diagnostic process can be lost.

BRIEF DESCRIPTION OF THE DRAWINGS

The figures are not to scale. Wherever possible, the same reference numbers will be used throughout the drawing(s) and accompanying written description to refer to the same or like parts, elements, etc.

DETAILED DESCRIPTION

Figure 1:
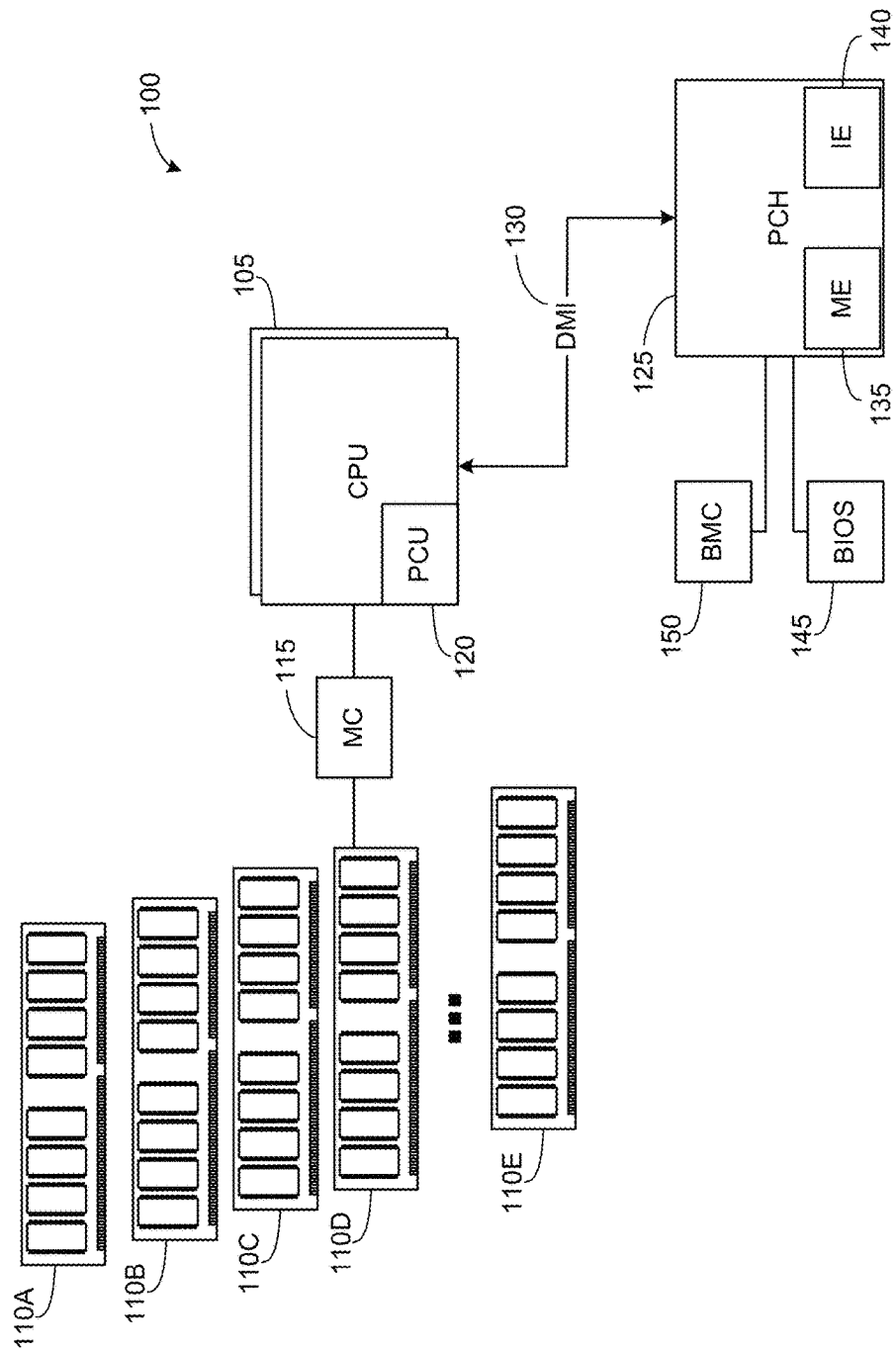
FIG. 1 is a block diagram of an example processor-based system implemented to utilize non-volatile random access memory for information storage in response to error conditions in accordance with the teachings of this disclosure.

Methods, apparatus, systems and articles of manufacture (e.g., physical storage media) to utilize non-volatile random access memory for information storage in response to error conditions are disclosed herein. Example methods disclosed herein to utilize non-volatile memory for information storage include accessing, with a power control unit associated with a processor, first information describing available capacities of respective reserved regions of one or more non-volatile memory modules. As disclosed in further detail below, the respective reserved regions of the non-volatile memory modules are separate from respective host-visible regions of the non-volatile memory modules. Disclosed example methods also include configuring, with the power control unit, an information storage architecture based on the first information. As disclosed in further detail below, the information storage architecture utilizes some or all of the respective reserved regions of the non-volatile memory modules to implement transient-permanent memory for information storage. Disclosed example methods further include storing, with the power control unit, second information in one or more of the respective reserved regions of the non-volatile memory modules in accordance with the information storage architecture.

In some disclosed example methods, the accessing of the first information includes receiving, via a system bus, a message including the first information from a memory controller controlling access to the non-volatile memory modules.

Additionally or alternatively, in some disclosed example methods, the first information includes respective locations and sizes for the respective reserved regions of the non-volatile memory modules. In some such example methods, the configuring of the information storage architecture includes storing the respective locations and sizes for the respective reserved regions of the non-volatile memory modules. In some such disclosed example methods, the configuring of the information storage architecture further includes using the respective locations and sizes for the respective reserved regions of the non-volatile memory modules to configure the power control unit to arrange the respective reserved regions of the non-volatile memory modules logically to implement data redundancy.

Additionally or alternatively, in some disclosed example methods, the storing of the second information is in response to an error condition. Some such disclosed example methods further include collecting, with the power control unit, the second information, and broadcasting, with the power control unit, the second information to the one or more of the respective reserved regions of the non-volatile memory modules via messages transmitted over a system bus.

Additionally or alternatively, some disclosed example methods further include restarting a host system including the processor after the storing of the second information. After the restarting of the host system, some such disclosed example methods also include retrieving the second information from the one or more of the respective reserved regions of the non-volatile memory modules.

In some disclosed examples, the non-volatile memory modules are implemented by non-volatile phase change memory modules, such as 3D XPoint™ dual in-line memory modules (DIMMs) from Intel Corp. and Micron Technology, Inc.

These and other example methods, apparatus, systems and articles of manufacture (e.g., physical storage media) to utilize of non-volatile random access memory for information storage in response to error conditions are disclosed in greater detail below.

As noted above, computers, servers and other processor-based systems include error handling features to provide diagnostic information after an error condition occurs. Examples of such error conditions include, but are not limited to, timeout conditions in which an operation fails to complete within an allotted amount of time, viral conditions, etc. For example, some processor-based systems provide a viral mode, which is an error containment mechanism that prevents writes to persistent storage from completing when a condition consistent with a virus is detected. By preventing writes to persistent storage upon a possible viral condition, viral mode can prevent data corruption in the processor-based system.

However, these and other types of error conditions can require a system reset (e.g., at least a warm reset in which power is not interrupted to the system) before diagnostics can be performed. After the system reset, information that may be helpful in the diagnostic process can be lost. For example, many viral or catastrophic error conditions are caused by misconfigured software and are not necessarily indicative of a hardware or silicon error. Thus, information describing the configuration of the system's central processing unit (CPU) may assist in diagnosing an error condition. However, such information may be lost after a system reset. As such, conventional error handling architectures may be unable to access such CPU configuration information, as well as other useful system information, such as operating system (OS) and silicon logs and/or configuration data, which can be lost after a system reset.

Example methods, apparatus, systems and articles of manufacture (e.g., physical storage media) provide technical solutions to these and other technical problems associated with error handling architectures by utilizing non-volatile memory, such as non-volatile random access memory (RAM), for information storage in response to error conditions, thereby permitting such stored information to be retained after a system reset. Example non-volatile memory utilization techniques disclosed herein configure an information storage architecture using reserved regions of the non-volatile memory modules, such as non-volatile DIMMs. For example, and as disclosed in further detail below, some such non-volatile memory utilization techniques use some or all of the respective reserved regions of the non-volatile memory modules to configure transient-permanent memory regions for information storage. Moreover, some disclosed example non-volatile memory utilization techniques arrange the transient-permanent memory regions logically to implement data redundancy, as described in further detail below. However, as disclosed in further detail below, the reserved regions of the non-volatile memory modules that are used to implement the transient-permanent memory regions for information storage are kept isolated from host-visible memory regions of the non-volatile memory modules. Such isolation can prevent the information stored in response to one or more error conditions from corrupting the data storage regions used by the host, processor-based system.

Some example non-volatile memory utilization techniques disclosed herein use the transient-permanent memory regions configured for the non-volatile memory modules to support error collection of data to help determine root causes of error conditions (e.g., at the OS level). For example, the error collection and storage can be performed automatically at the silicon level, such as by a power control unit, as described in further detail below. Additionally or alternatively, some disclosed example non-volatile memory utilization techniques enable the BIOS, OS and/or one or more applications to use the transient-permanent memory regions for data storage. Additionally or alternatively, some disclosed example non-volatile memory utilization techniques provide mechanisms for migrating data from the transient-permanent memory regions to persistent memory.

Turning to the figures, a block diagram of an example processor-based system 100 implemented to utilize non-volatile memory for information storage in accordance with the teachings of this disclosure is illustrated in FIG. 1. The example processor-based system 100 of FIG. 1 includes one or more example CPUs 105. The example CPU(s) 105 can be implemented by any type(s) and/or number(s) of processors, processing units, etc., such as one or more Intel® processors. For example, the CPU(s) 105 can be implemented by one or processors such as the example processor 1112 in the example processor platform 1100 of FIG. 11.

The example processor-based system 100 of FIG. 1 also includes one or more example non-volatile memory modules 110A-E in communication with the example CPU(s) 105 via an example memory controller (MC) 115. As used herein, the phrase "in communication," including variances thereof, encompasses direct communication and/or indirect communication through one or more intermediary components and does not require direct physical (e.g., wired) communication and/or constant communication, but rather additionally includes selective communication at periodic or aperiodic intervals, as well as one-time events.

In the illustrated example of FIG. 1, the non-volatile memory modules 110A-E are implemented by example non-volatile DIMMs 110A-E, such as example 3D XPoint™ DIMMs from Intel Corp. and Micron Technology, Inc. However, the non-volatile memory modules 110A-E are not limited thereto. Rather, the non-volatile memory modules 110A-E may be implemented by any type(s) and/or number(s) of non-volatile RAM modules, chips, devices, etc.

In the example processor-based system 100 of FIG. 1, the memory controller 115 manages the flow of data between the CPU(s) 105 and the non-volatile DIMMs 110A-E. As such, the memory controller 115 implements the interface between the non-volatile DIMMs 110A-E and the CPU(s) 105. Although the memory controller 115 is illustrated as being implemented as a silicon component separate from the CPU(s) 105, in some examples, the memory controller 115 is integrated into one or more of the CPU(s) 105. In the illustrated example of FIG. 1, the memory controller 115 also segments the available memory of the non-volatile DIMMs 110A-E into respective host-visible regions and reserved regions (also referred to as spare regions). An example of such memory segmentation is illustrated in FIG. 2.

Figure 2:
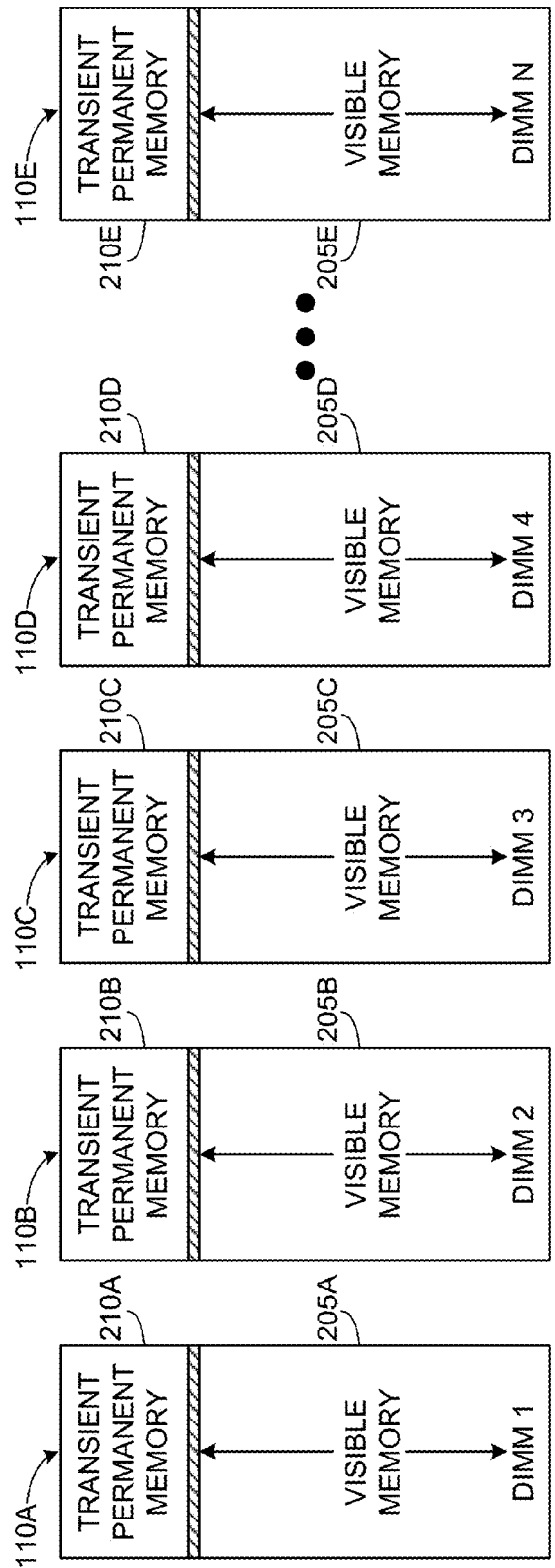
FIG. 2 is a block diagram of example non-volatile memory modules that may be used to implement the example processor-based system of FIG. 1.

In the illustrated example of FIG. 2, the memory controller 115 has segmented the available memory of the non-volatile DIMMs 110A-E into respective host-visible memory regions 205A-E and separate respective reserved memory regions 210A-E. The respective host-visible memory regions 205A-E are made visible to the CPU(s) 105 (and other elements of the system 100, as appropriate) by the memory controller 115. However, the respective reserved memory regions 210A-E are kept hidden from the CPU(s) 105 and other elements of the system 100. As such, the reserved memory regions 210A-E are kept isolated from the host-visible memory regions 205A-E by the memory controller 115. In some examples, the reserved regions 210A-E include between 5% and 7% of the available capacity of the respective non-volatile DIMMs 110A-E. For example, if the non-volatile DIMMs 110A-E each have an available capacity of 512 GB, then the reserved regions 210A-E may each have a capacity on the order of approximately 25 GB per DIMM.

As disclosed in further detail below, the memory controller 115 of the illustrated example is able to indicate the capacity of each of the reserved regions 210A-E of the non-volatile DIMMs 110A-E. As illustrated in the example of FIG. 2, and also disclosed in further detail below, the processor-based system 100 of FIG. 1 uses the respective reserved regions 210A-E of the non-volatile DIMMs 110A-E to implement an example transient-permanent information storage architecture to store information in accordance with the teachings of this disclosure. In this context, the term "transient-permanent" refers to the ability of the disclosed information storage architecture to take information that, in the past, would have been transient (e.g., such as state and/or other information associated with an error condition) and store this information in a permanent (or semi-permanent) manner such that the data is retrievable after a system reset.

Returning to FIG. 1, one or more of the example CPU(s) 105 of the example processor-based system 100 each include an example power control unit (PCU) 120. The PCU 120 of the illustrated example performs power management for one or more of the example CPU(s) 105. For example, the PCU 120 can monitor processor usage, temperature sensor data, error conditions, etc., to route power to different cores of the CPU(s) 105, to restart the CPU(s) in response to detected error condition(s), etc. In the illustrated example of FIG. 1, the PCU 120 also configures and implements an example transient-permanent information storage architecture using the respective reserved regions 210A-E of the non-volatile DIMMs 110A-E, as disclosed in further detail below.

The example processor-based system 100 of FIG. 1 also includes an example platform controller hub (PCH) 125 in communication with the example CPU(s) 105 via an example direct media interface (DMI) 130. In addition to providing support functions, such as system clocking, input/output (I/O) interfaces, etc., the PCH 125 of the illustrated example also implements an example management engine (ME) 135 and an example innovation engine (IE) 140. The example ME 135 of the illustrated example corresponds to the Intel® ME, which provides remote, hardware-level interaction with and management of the processor-based system 100 by an administrator. The example IE 140 of the illustrated example corresponds to Intel® IE, which provides a processor and I/O subsystems to support inclusion of customer-specific firmware in the processor-based system 100.

The example PCH 125 of FIG. 1 further interfaces an example BIOS 145 and an example baseboard management controller (BMC) 150 with the example processor-based system 100. The BIOS 145 of the illustrated example is implemented by firmware that performs hardware initialization during booting of the processor-based system 100. The BMC 150 of the illustrated example monitors physical operation of the processor-based system 100. For example, the BMC 150 includes one or more sensors to monitor various operating conditions of the processor-based system 100, such as temperature, humidity, fan speeds, supply voltage, OS functions, network communications, etc. The BMC 150 also indicates whether any of these monitored conditions corresponds to an error condition (e.g., by setting one or more bits/values in one or more registers, by sending one or more messages via the PCH 125, etc.).

Figure 3:
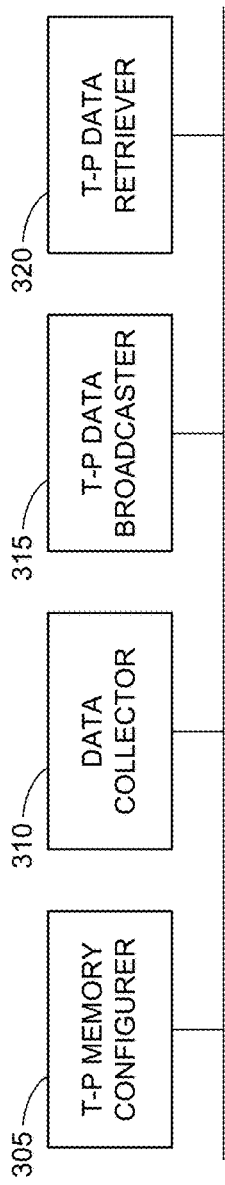
FIG. 3 is a block diagram of example power control unit that may be used to implement the example processor-based system of FIG. 1.
Figure 4:
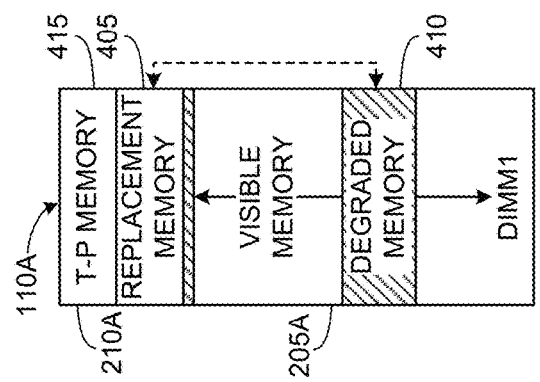
FIG. 4 is a block diagram further illustrating one of the example non-volatile memory modules of FIG. 2.

As noted above, the PCU 120 of the illustrated example configures and implements an example transient-permanent information storage architecture using the respective reserved regions 210A-E of the non-volatile DIMMs 110A-E. A block diagram illustrating an example implementation of the PCU 120 is provided in FIG. 3. The block diagram of FIG. 3 illustrates elements of the PCU 120 that are relevant to the teachings of this disclosure. Elements of the PCU 120 implementing other functionality are omitted for clarity.

Turning to FIG. 3, the example PCU 120 includes an example transient-permanent (T-P) memory configurer 305 to configure an information storage architecture using the respective reserved regions 210A-E of the non-volatile DIMMs 110A-E. In some examples, the transient-permanent memory configurer 305 configures the transient-permanent information storage architecture as follows. With reference to FIGS. 1-3, during initialization of the example processor-based system 100 (e.g., by the BIOS 145), the memory controller 115 reports capacity information describing the available capacities of the respective reserved regions 210A-E of the non-volatile DIMMs 110A-E included in the system 100. In some examples, the memory controller 115 reports this reserved memory capacity information via one or more messages transmitted via a communication bus, such as a peripheral component interconnect express (PCIe) bus. For example, the messages can be formatted according to any appropriate communication protocol, such as a message console transport protocol (MCTP), capable of being encapsulated and transported via the communication bus (e.g., PCIe bus). In some examples, the memory controller 115 additionally or alternatively reports the reserved memory capacity information for the non-volatile DIMMs 110A-E by setting one or more values in one or more registers (e.g., such as one or more control and status registers, or CSRs).

Figure 5:
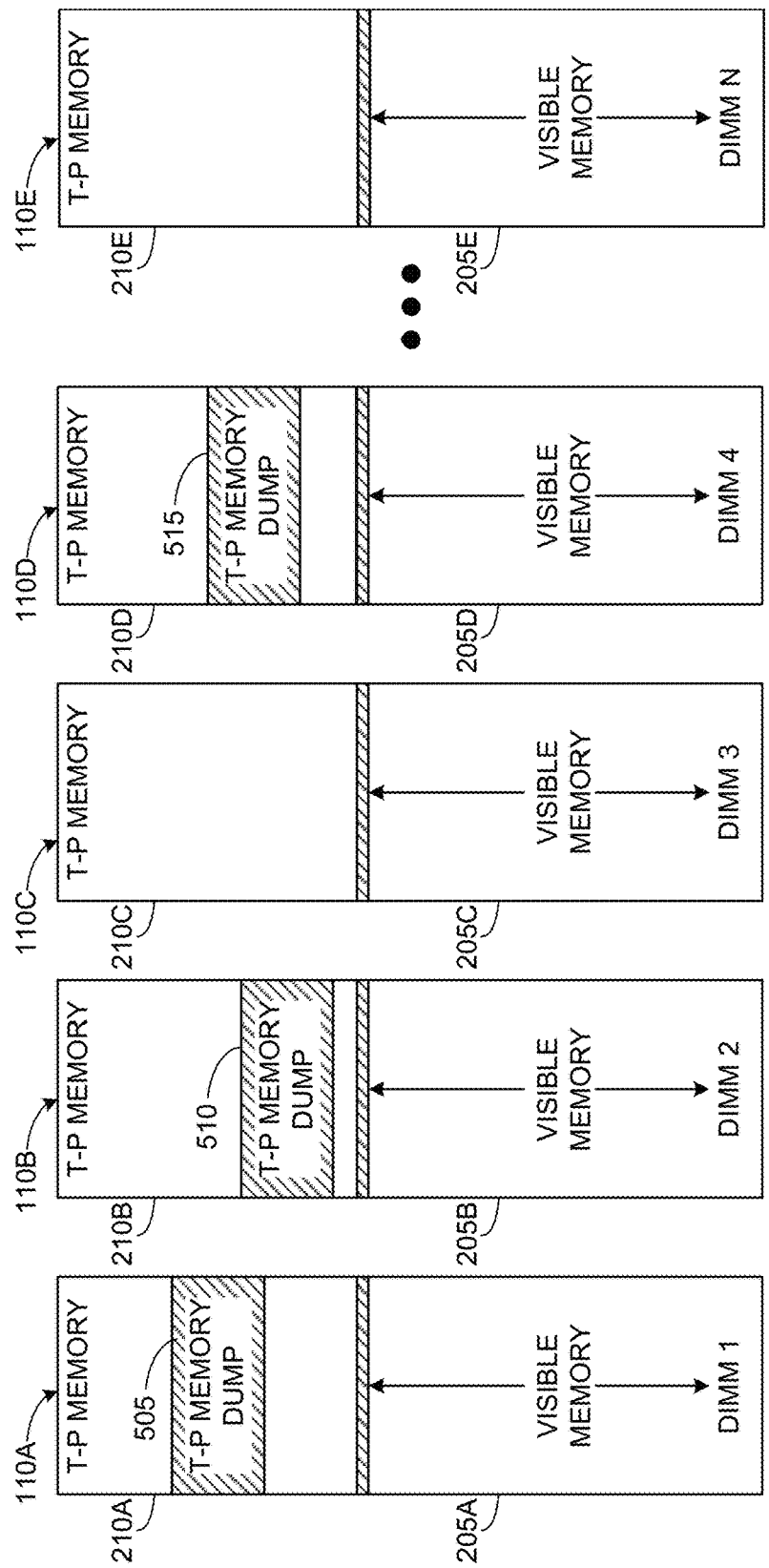
FIG. 5 illustrates an example utilization of reserved regions of the example non-volatile memory modules of FIGS. 1 and/or 2 to store information in accordance with an example information storage architecture configured by the example power control unit of FIGS. 1 and/or 3.

In some examples, the reserved memory capacity information reported by the memory controller 115 includes respective locations (e.g., base addresses) and sizes for the respective reserved regions 210A-E of the non-volatile DIMMs 110A-E. Because the reserved regions 210A-E of the non-volatile DIMMs 110A-E may have uses other than for implementing a transient-permanent information storage architecture in accordance with the teaching of this disclosure, the memory controller 115 can report the locations and sizes of the respective reserved memory regions 210A-E in a manner to exclude any portion(s) of the region(s) already in use (or reserved for) other purposes. For example, FIG. 5 illustrates an example scenario in which an example portion 405 of the reserved region 210A of the non-volatile DIMM 110A has been used by the memory controller 115 to replace a corresponding degraded portion 410 of the visible region 205A of the non-volatile DIMM 110A. Accordingly, when reporting the reserved memory capacity information for the non-volatile DIMM 110A, the memory controller 115 may report location and size information describing a remaining region 415 of the reserved region 210A of the non-volatile DIMM 110A, which is available for use by the PCU 120 to configure and implement the transient-permanent information storage architecture for the system 100.

Returning to FIG. 3, the transient-permanent memory configurer 305 of the PCU 120 receives the capacity information (e.g., respective locations and sizes) broadcast by the memory controller 115 (e.g., via MCTP messaging over a PCIe bus) for the respective reserved regions 210A-E of the non-volatile DIMMs 110A-E during system initialization. The example transient-permanent memory configurer 305 of the PCU 120 then stores (e.g., in local memory, registers, etc.) the locations and sizes of the respective reserved regions 210A-E of the non-volatile DIMMs 110A-E to configure each reserved memory region 210A-E capable of being included in the transient-permanent information storage architecture. In some examples, the transient-permanent memory configurer 305 further uses the stored locations and sizes of the respective reserved regions 210A-E of the non-volatile DIMMs 110A-E to arrange the reserved memory regions 210A-E logically to implement data redundancy. For example, the transient-permanent memory configurer 305 can use the stored locations and sizes of the respective reserved memory regions 210A-E to group multiple regions together to implement data mirroring, data striping, one or more redundant array of independent disks (RAID) configurations, etc., as illustrated in the example of FIG. 5, which is described below.

The example PCU 120 of FIG. 3 also includes an example data collector 310 to collect information to be stored in the reserved memory regions 210A-E included in the transient-permanent information storage architecture configured by the transient-permanent memory configurer 305. In the example processor-based system 100 of FIG. 1, one or more of the CPU(s) 105, the memory controller 115, the PCH 125, the ME 135, the IE 140, the BIOS 145, the BMC 150 and/or other physical units (e.g., p-units), system agents, etc., are capable of signaling error conditions by setting one or more values in one or more registers, by broadcasting error information in messaging over a communication bus (e.g., MCTP messages over a PCIe bus), etc. The data collector 310 of the PCU 120 detects such error condition(s) and collects information relevant to the detected error condition(s). For example, the data collector 310 of the PCU 120 can be configured to collect different crash dump data for different error conditions. In some such examples, for a given possible error condition, the data collector 310 of the PCU 120 is configured to collect specific log data, specific memory contents, specific register values, etc., or any combination thereof to include in the crash dump information when that possible error condition is detected. Additionally or alternatively, the data collector 310 can utilize top-of-rack (TOR) features available to the processor-based system 100 to collect the data to be stored in response to the detected error condition(s).

The example PCU 120 of FIG. 3 also includes an example data broadcaster 315 to broadcast the information (e.g., crash dump data) collected by the data collector 310 for storage in the reserved memory regions 210A-E included in the transient-permanent information storage architecture configured by the transient-permanent memory configurer 305. In some examples, the data broadcaster 315 of the PCU 120 broadcasts the information in messaging over a communication bus (e.g., MCTP messages over a PCIe bus) to cause the information to be stored in the reserved memory regions 210A-E with data redundancy as configured by the transient-permanent memory configurer 305. Additionally or alternatively, in some examples, the data broadcaster 315 of the PCU 120 writes the information to the reserved memory regions 210A-E via one or more memory-mapped I/O (MMIO) mailboxes, and with data redundancy as configured by the transient-permanent memory configurer 305.

In some examples, to implement the data redundancy configured by the transient-permanent memory configurer 305, the data broadcaster 315 of the PCU 120 can broadcast the information for duplicate storage in multiple (two or more) of the reserved memory regions 210A-E. For example, the data broadcaster 315 can broadcast the same information in multiple messages over a communication bus (e.g., multiple MCTP messages over a PCIe bus) to store duplicate versions of the information in more than one of the reserved memory regions 210A-E to implement data mirroring, data striping, RAID storage, etc., according to the type of data redundancy configured by the transient-permanent memory configurer 305. An example of the data broadcaster 315 of the PCU 120 utilizing the reserved regions 210A-E of the non-volatile memory modules 110A-E to store information with data redundancy as configured by the transient-permanent memory configurer 305 is illustrated in FIG. 5.

In the illustrated example of FIG. 5, the data broadcaster 315 of the PCU 120 is to broadcast a crash dump (labeled "T-P Memory Dump" in FIG. 5) for storage in the transient-permanent information storage architecture configured by the transient-permanent memory configurer 305 of the PCU 120. In the illustrated example, the transient-permanent memory configurer 305 used the capacity information (e.g., location and size information) broadcast by the memory controller 115 to configure the reserved memory regions 210A, 210B and 210D to implement three-way data mirroring with location offsets. Accordingly, the data broadcaster 315 of the PCU 120 broadcast three (3) instances 505, 510 and 515 of the crash dump for storage in the respective reserved memory regions 210A, 210B and 210D, as shown, to implement the configured data redundancy.

As further illustrated in the example of FIG. 5, the transient-permanent information storage architecture provided by the reserved memory regions 210A-E is isolated from the visible regions 205A-E of the non-volatile memory modules 110A-E by the memory controller 115 of the example processor-based system 100. Such isolation prevents the host-visible memory regions 205A-E from being contaminated by data being stored by the PCU 120 in response to an error condition. For example, if the error condition corresponds to a detected viral condition, the data being stored by the PCU 120 can include the virus. The isolation of the reserved memory regions 210A-E from the visible regions 205A-E of the non-volatile memory modules 110A-E allows potential viral data to be stored for later diagnosis without running the risk of the viral data being propagated to other parts of the processor-based system 100.

In some examples, the PCU 120 of FIG. 3 also includes an example data retriever 320 to retrieve information that was stored in the transient-permanent information storage architecture provided by the reserved regions 210A-E of the non-volatile DIMMs 110A-E. For example, after detecting an error condition and broadcasting the collected crash dump information for storage in the configured transient-permanent reserved memory regions 210A-E, the PCU 120 may issue a system reset (e.g., a warm reset) to allow the processor-based system 100 to recover from the detected error condition. After the system reset, the example data retriever 320 of the PCU 120 can retrieve the information (e.g., crash dump data) that was stored in the transient-permanent reserved memory regions 210A-E prior to the reset. In some examples, the data retriever 320 of the PCU 120 broadcasts the retrieved information in messaging over a communication bus (e.g., MCTP messages over a PCIe bus) for receipt by one or more system agents, such as the ME 135, the IE 140, the BIOS 145, the BMC 150, etc., to support diagnosis of the error condition.

In some examples, one or more of the functions of the PCU 120 described above can be implemented by system software and/or one or more other system agents of the example processor-based system 100. For example, because messaging over a communication bus (e.g., MCTP messages over a PCIe bus) is used to store data to and retrieve data from the reserved regions 210A-E of the non-volatile DIMMs 110A-E, the functionality of the example data retriever 320 described above may additionally or alternatively be implemented by system software and/or one or more other system agents of the example processor-based system 100. In some such examples, one or more of the ME 135, the IE 140, the BIOS 145, the BMC 150, etc., can implement the functionality of the data retriever 320 to retrieve the crash dump data stored in the transient-permanent information storage architecture provided by the reserved regions 210A-E of the non-volatile DIMMs 110A-E.

In some examples, the crash dump data retrieved from the transient-permanent information storage architecture provided by the reserved regions 210A-E of the non-volatile DIMMs 110A-E is further sent to an application executed by the CPU(s) 105 of the processor-based system for further analysis (e.g., to facilitate field debug of the error condition). Additionally or alternatively, in some examples, the crash dump data retrieved from the transient-permanent information storage architecture provided by the reserved memory regions 210A-E is sent, via a network, to a remote application, diagnostic tool, etc., for analysis by a remote administrator, original equipment manufacturer (OEM), cloud service provider (CSP), etc.

In some examples, because messaging over a communication bus (e.g., MCTP messages over a PCIe bus) is used to store data to and retrieve data from the reserved regions 210A-E of the non-volatile DIMMs 110A-E, the functionality of the example data collector 310 and/or the example data broadcaster 315 described above may additionally or alternatively be implemented by system software and/or one or more other system agents of the example processor-based system 100. For example, one or more of the CPU(s) 105, the memory controller 115, the PCH 125, the ME 135, the IE 140, the BIOS 145, the BMC 150 and/or other p-units, system agents, etc., can be configured to write their respective error logs, error register values, etc., independently to the transient-permanent information storage architecture provided by the reserved regions 210A-E of the non-volatile DIMMs 110A-E (e.g., without intervention by the PCU 120). By allowing system software and/or other system agents of the processor-based system 100 to store data in the transient-permanent information storage architecture provided by the reserved regions 210A-E of the non-volatile DIMMs 110A-E, crash dump data can be collected even if the PCU 120 itself is the source of the error condition (e.g., and is locked up).

Figure 9:
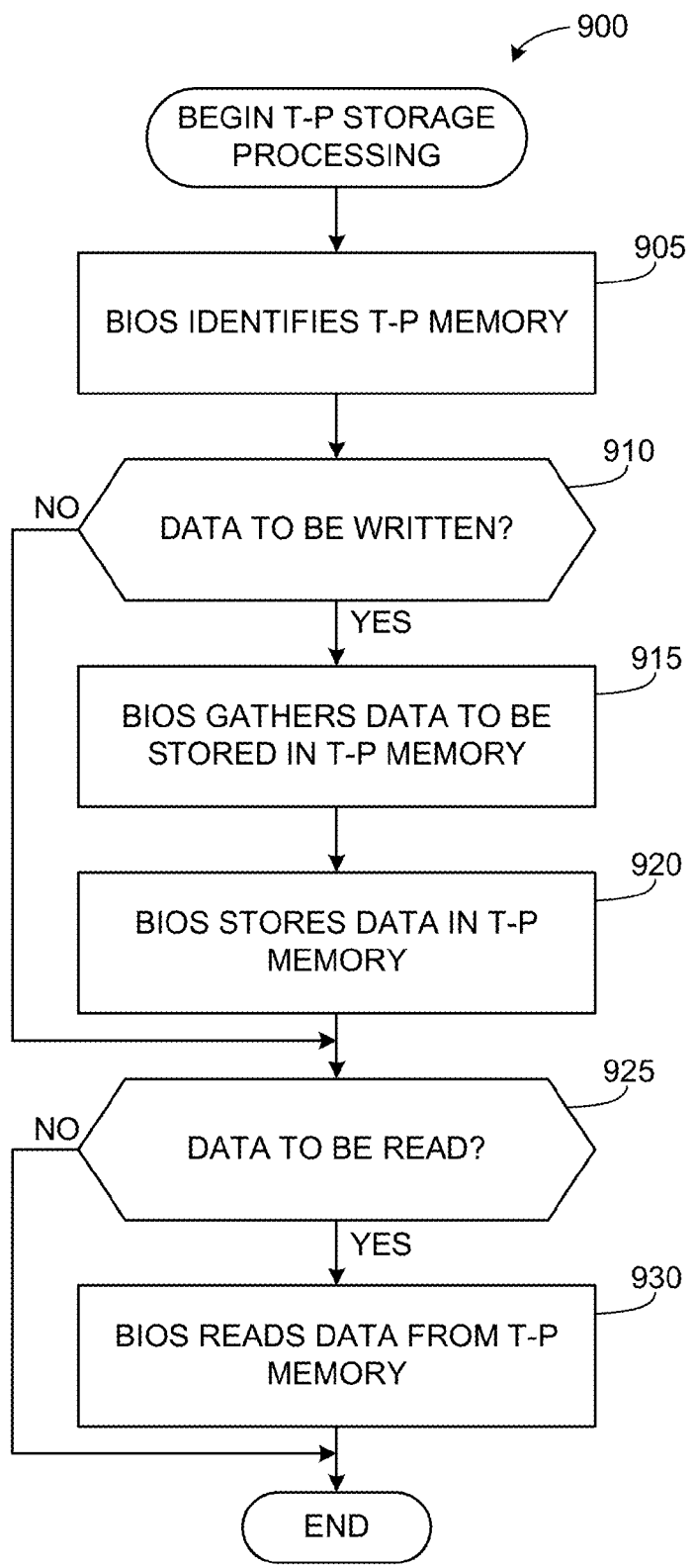
FIG. 9 is a flowchart representative of example machine readable instructions that may be executed by an example basic input/output system (BIOS) included in the example processor-based system of FIG. 1 to store information in and retrieve information from an example information storage architecture implemented using reserved regions of the example non-volatile memory modules of FIGS. 1 and/or 2.

Although the foregoing description has focused on storing information in the transient-permanent information storage architecture provided by the reserved regions 210A-E of the non-volatile DIMMs 110A-E in response to an error condition, utilization of the transient-permanent information storage architecture disclosed herein is not limited thereto. For example, one or more of the BIOS 145, the OS executed by the CPU(s) 105, an application executed by the CPU(s) 105, can be configured to use the transient-permanent information storage architecture provided by the reserved memory regions 210A-E to store data. In some such examples, when using the transient-permanent information storage architecture provided by the reserved memory regions 210A-E to store data for survivability, the BIOS 145, the OS, the application, etc., can be configured to store the data according to a RAID or other data redundancy configuration. A further example of such utilization of the transient-permanent information storage architecture provided by the reserved regions 210A-E of the non-volatile DIMMs 110A-E is illustrated in FIG. 9, which is described below.

Figure 10:
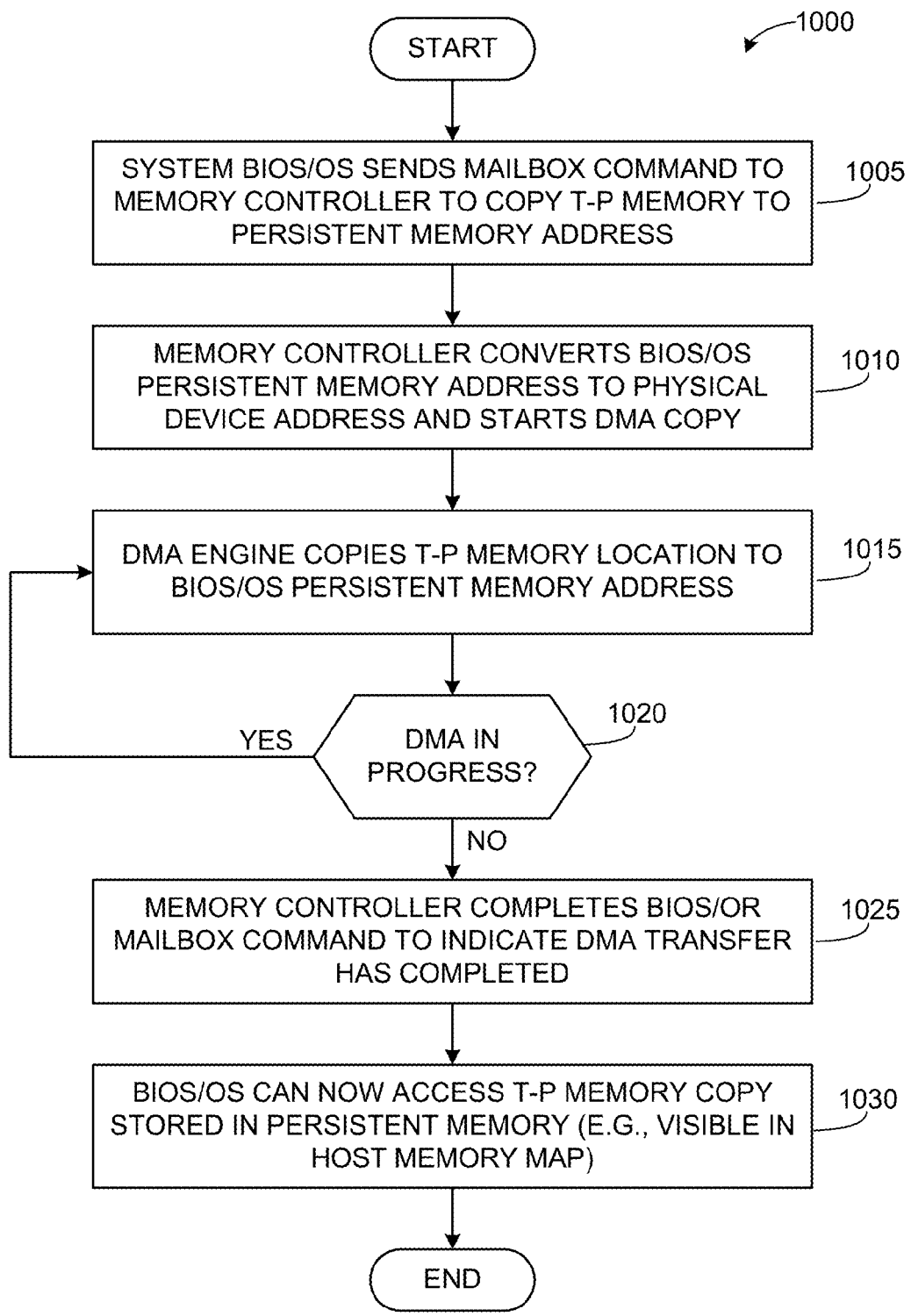
FIG. 10 is a flowchart representative of example machine readable instructions that may be executed in the example processor-based system of FIG. 1 to migrate information from an example information storage architecture implemented using reserved regions of the example non-volatile memory modules of FIGS. 1 and/or 2 to persistent memory.

In some examples, it may be desirable to migrate stored data from the transient-permanent information storage architecture provided by the reserved regions 210A-E of the non-volatile DIMMs 110A-E to persistent memory, such as the host-visible regions 205A-E of the non-volatile DIMMs 110A-E. In some such examples, one or more of the BIOS 145, the OS executed by the CPU(s) 105, an application executed by the CPU(s) 105, etc., can be configured to invoke the memory controller 115 to cause data to be migrated (e.g., via direct memory access copying) from the reserved memory regions 210A-E to the visible memory regions 205A-E of the non-volatile DIMMs 110A-E. However, to avoid data corruption, such migration may be limited to data not associated with a viral condition. A further example of such data migration is illustrated in FIG. 10, which is described below.

While an example manner of implementing the example processor-based system 100 is illustrated in FIGS. 1-5, one or more of the elements, processes and/or devices illustrated in FIGS. 1-5 may be combined, divided, re-arranged, omitted, eliminated and/or implemented in any other way. Further, the example CPU(s) 105, the example memory controller 115, the example PCU 120, the example PCH 125, the example ME 135, the example IE 140, the example BIOS 145, the example BMC 150, the example transient-permanent memory configurer 305, the example data collector 310, the example data broadcaster 315, the example data retriever 320 and/or, more generally, the example processor-based system 100 of FIGS. 1-5 may be implemented by hardware, software, firmware and/or any combination of hardware, software and/or firmware. Thus, for example, any of the example CPU(s) 105, the example memory controller 115, the example PCU 120, the example PCH 125, the example ME 135, the example IE 140, the example BIOS 145, the example BMC 150, the example transient-permanent memory configurer 305, the example data collector 310, the example data broadcaster 315, the example data retriever 320 and/or, more generally, the example processor-based system 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example processor-based system 100, the example CPU(s) 105, the example memory controller 115, the example PCU 120, the example PCH 125, the example ME 135, the example IE 140, the example BIOS 145, the example BMC 150, the example transient-permanent memory configurer 305, the example data collector 310, the example data broadcaster 315 and/or the example data retriever 320 is/are hereby expressly defined to include a tangible computer readable storage device or storage disk such as a memory, a digital versatile disk (DVD), a compact disk (CD), a Blu-ray disk, etc. storing the software and/or firmware. Further still, the example processor-based system 100 may include one or more elements, processes and/or devices in addition to, or instead of, those illustrated in FIGS. 1-5, and/or may include more than one of any or all of the illustrated elements, processes and devices.

Flowcharts representative of example processes for implementing the example processor-based system 100, the example CPU(s) 105, the example memory controller 115, the example PCU 120, the example PCH 125, the example ME 135, the example IE 140, the example BIOS 145, the example BMC 150, the example transient-permanent memory configurer 305, the example data collector 310, the example data broadcaster 315 and/or the example data retriever 320, which can be implemented by hardware operation, machine readable instructions, and/or a combination thereof, are shown in FIGS. 6-10. In some examples, the machine readable instructions comprise one or more programs for execution by a processor, such as the processor 1112 shown in the example processor platform 1100 discussed below in connection with FIG. 11. The one or more programs, or portion(s) thereof, may be embodied in software stored on a tangible computer readable storage medium such as a CD-ROM, a floppy disk, a hard drive, a digital versatile disk (DVD), a Blu-ray disk™, or a memory associated with the processor 1112, but the entire program or programs and/or portions thereof could alternatively be executed by a device other than the processor 1112 and/or embodied in firmware or dedicated hardware (e.g., implemented by an ASIC, a PLD, an FPLD, discrete logic, etc.). Further, although the example hardware operations and/or machine readable instructions are described with reference to the flowcharts illustrated in FIGS. 6-10, many other methods of implementing the example processor-based system 100, the example CPU(s) 105, the example memory controller 115, the example PCU 120, the example PCH 125, the example ME 135, the example IE 140, the example BIOS 145, the example BMC 150, the example transient-permanent memory configurer 305, the example data collector 310, the example data broadcaster 315 and/or the example data retriever 320 may alternatively be used. For example, with reference to the flowcharts illustrated in FIGS. 6-10, the order of execution of the blocks may be changed, and/or some of the blocks described may be changed, eliminated, combined and/or subdivided into multiple blocks.

As mentioned above, the example processes of FIGS. 6-10 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 6-10 may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the terms "comprising" and "including" are open ended. Also, as used herein, the terms "computer readable" and "machine readable" are considered equivalent unless indicated otherwise.

Figure 6:
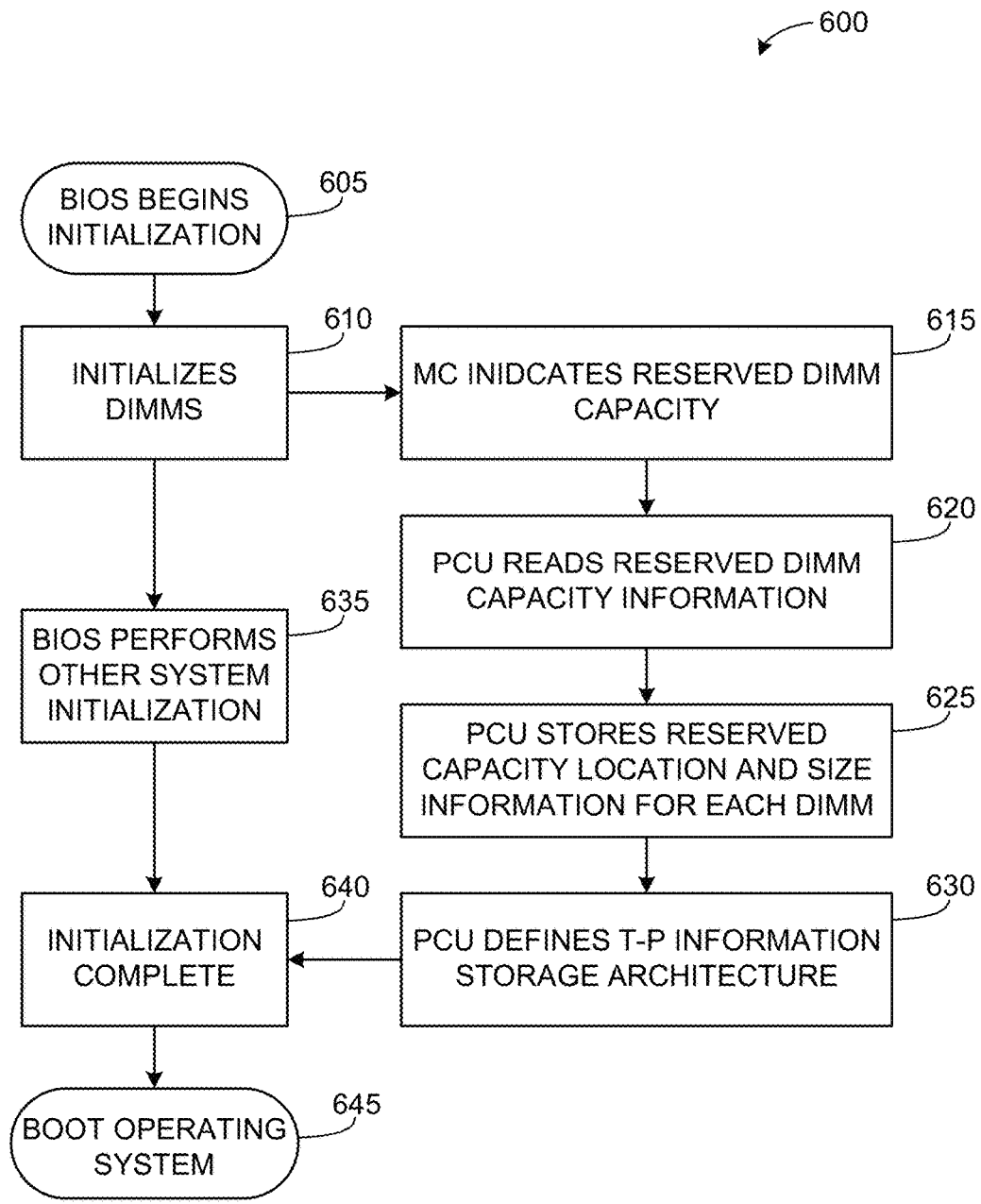
FIG. 6 is a flowchart representative of example machine readable instructions that may be executed in the example processor-based system of FIG. 1 to implement an example information storage architecture using reserved regions of the example non-volatile memory modules of FIGS. 1 and/or 2.

An example process 600 implementable by hardware operations, machine readable instructions, and/or a combination thereof, which may be executed to configure and implement an example transient-permanent information storage architecture in the example processor-based system 100 is illustrated in FIG. 6. With reference to the preceding figures and associated written descriptions, the example process 600 of FIG. 6 begins execution at block 605 at which the example BIOS 145 begins initializing the processor-based system 100 (e.g., at power up). As part of the initialization process, at block 610 the BIOS 145 initializes the example non-volatile DIMMs 110A-E. For example, at block 610, the BIOS 145 determines the number, sizes, locations, etc., of the DIMMs 110A-E, and provides this information to the example memory controller 115. At block 615, the memory controller 115 reports capacity information describing the available capacities of the respective reserved regions 210A-E of the non-volatile DIMMs 110A-E, as described above. At block 620, the example transient-permanent memory configurer 305 of the example PCU 120 reads the capacity information reported by the memory controller 115 for the respective reserved regions 210A-E of the non-volatile DIMMs 110A-E, as described above. At block 625, the transient-permanent memory configurer 305 of the PCU 120 stores the location and sizes of the respective reserved regions 210A-E of the non-volatile DIMMs 110A-E reported by the memory controller 115, as described above.

At block 630, the transient-permanent memory configurer 305 of the PCU 120 uses the stored locations and sizes of the respective reserved memory regions 210A-E to configure, as described above, the transient-permanent information storage architecture for use in the example processor-based system 100. For example, the transient-permanent memory configurer 305 can use the location and size information to arrange the reserved memory regions 210A-E logically to implement data redundancy, as described above. Meanwhile, at block 635 the BIOS 145 continues initializing other elements of the processor-based system 100. At block 640, the BIOS 145 determines that system initialization is complete. At block 645, the OS of the processor-based system 100 is booted to allow system operation to begin.

Figure 7:
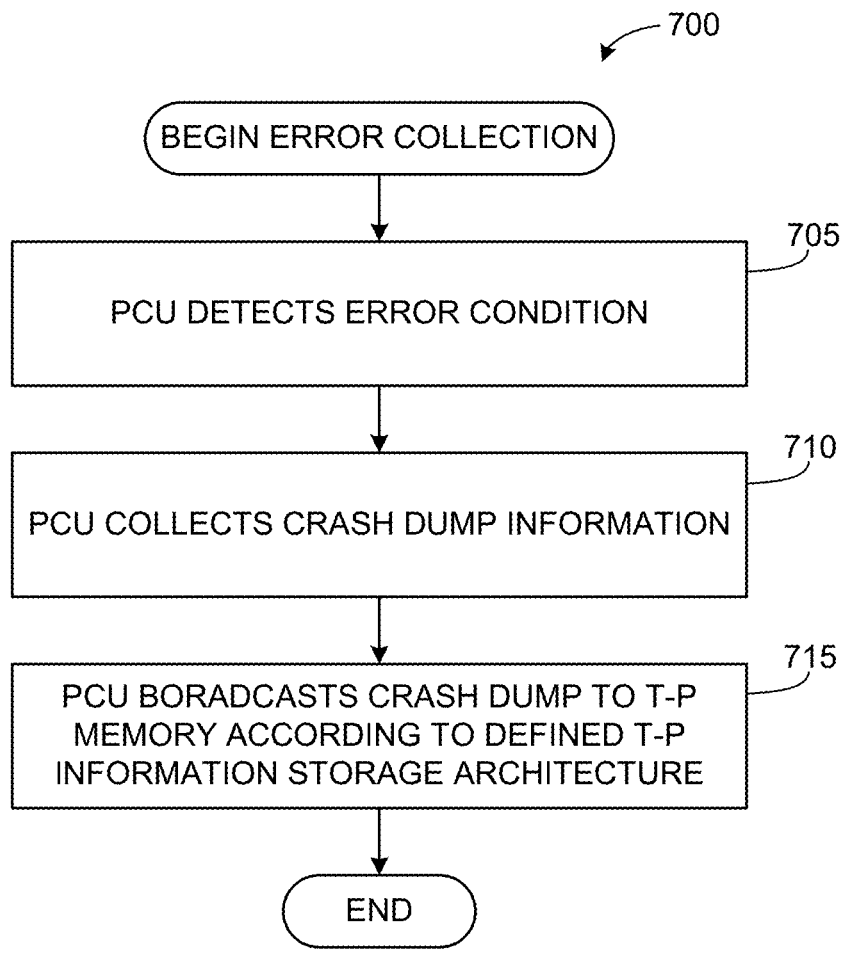
FIG. 7 is a flowchart representative of example machine readable instructions that may be executed by the example power control unit of FIGS. 1 and/or 3 to store information in an example information storage architecture implemented using reserved regions of the example non-volatile memory modules of FIGS. 1 and/or 2.

An example process 700 implementable by hardware operations, machine readable instructions, and/or a combination thereof, which may be executed to collect information in response to an error condition and store the information an example transient-permanent information storage architecture in the example processor-based system 100 is illustrated in FIG. 7. With reference to the preceding figures and associated written descriptions, the example process 700 of FIG. 7 begins execution at block 705 at which the example data collector 310 of the example PCU 120 detects an error condition in the processor-based system 100, as described above. At block 710, the data collector 310 of the PCU 120 collects crash dump information, as described above, in response to the error condition. At block 715, the example data broadcaster 315 of the PCU 120 broadcasts the collected crash dump information for storage in one or more of the reserved regions 210A-E of the non-volatile memory modules 110A-E in accordance with the transient-permanent information storage architecture configured by the transient-permanent memory configurer 305 of the PCU 120, as described above.

Figure 8:
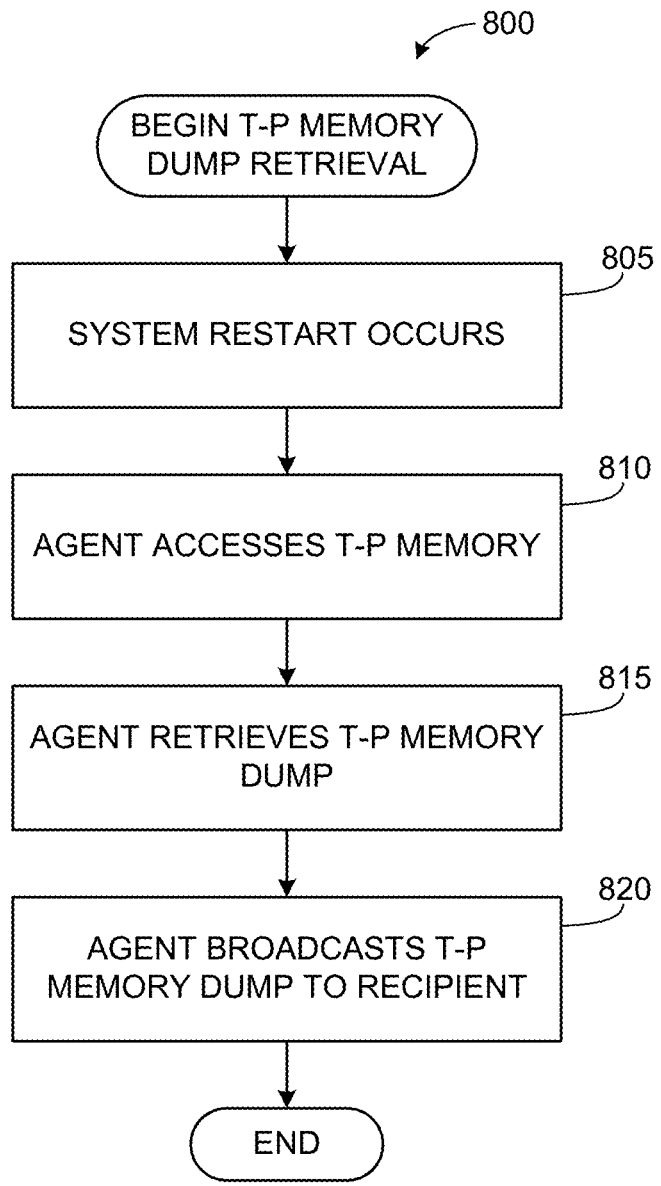
FIG. 8 is a flowchart representative of example machine readable instructions that may be executed by the example power control unit of FIGS. 1 and/or 3, and/or another system agent implemented in the example processor-based system of FIG. 1, to retrieve information that was stored in an example information storage architecture implemented using reserved regions of the example non-volatile memory modules of FIGS. 1 and/or 2.

An example process 800 implementable by hardware operations, machine readable instructions, and/or a combination thereof, which may be executed to retrieve information from an example transient-permanent information storage architecture in the example processor-based system 100 is illustrated in FIG. 8. With reference to the preceding figures and associated written descriptions, the example process 800 of FIG. 8 begins execution at block 805 at which a system restart occurs. For example, the PCU 120 may restart the processor-based system 100 after an error condition to allow the system to recover from the error. At block 810, a system agent accesses the transient-permanent information storage architecture provided by the reserved regions 210A-E of the non-volatile DIMMs 110A-E. At block 815, the system agent retrieves crash dump information stored in the transient-permanent information storage architecture provided by the reserved memory regions 210A-E. At block 820, the system agent broadcasts the crash dump information to one or more recipients. In the illustrated example of FIG. 8, the system agent can be one or more of (1) the example data retriever 320 of the example PCU 120, (2) the example ME 135, (3) the example IE 140, (4) the example BIOS 145, (5) the example BMC 150, (6) the OS of the processor-based system 100, (7) an application executed by the example CPU(s) 105, and/or any other system agent or agents, or combination thereof. In the illustrated example of FIG. 8, the recipient can be one or more of (1) the example ME 135, (2) the example IE 140, (3) the example BIOS 145, (4) the example BMC 150, (5) the OS of the processor-based system 100, (6) an application executed by the example CPU(s) 105, (7) a remote agent/tool accessible via a network, and/or any other recipient or recipients, or combination thereof.

An example process 900 implementable by hardware operations, machine readable instructions, and/or a combination thereof, which may be executed by the example BIOS 145 to store data in and retrieve data from an example transient-permanent information storage architecture in the example processor-based system 100 is illustrated in FIG. 9. With reference to the preceding figures and associated written descriptions, the example process 900 of FIG. 9 begins execution at block 905 at which the BIOS 145 identifies the reserved regions 210A-E of the non-volatile DIMMs 110A-E, which are available for implementing a transient-permanent information storage architecture. For example, at block 905, the BIOS 145 can read one or more registers and/or receive one or more messages from the memory controller 115 providing capacity information for the reserved regions 210A-E of the non-volatile DIMMs 110A-E, as described above.

At block 910, the BIOS 145 determines whether there is data to be written to the transient-permanent information storage architecture. If there is data to be written (block 910), at block 915 the BIOS 145 gathers the data to be written to the transient-permanent information storage architecture. Then, at block 920, the stores the data in the transient-permanent information storage architecture by, for example, broadcasting the information in messaging over a communication bus (e.g., MCTP messages over a PCIe bus), writing the data to one or more MMIO mailboxes, etc., and with any data redundancy configured for the transient-permanent information storage architecture.

At block 925, the BIOS 145 determines whether there is data to be read from the transient-permanent information storage architecture. If there is data to be read (block 925), at block 930 the BIOS 145 reads the data from the transient-permanent information storage architecture provided by the reserved regions 210A-E of the non-volatile DIMMs 110A-E. In some examples, the process 900 can be implemented by one or more system agents other than, or in addition to, the BIOS 145. For example, the process 900 can additionally or alternatively be implemented by the OS of the processor-based system 100 and/or one or more applications executing on the CPUs 105 to permit the OA and/or application(s) to write data to and/or read data from the transient-permanent information storage architecture provided by the reserved regions 210A-E of the non-volatile DIMMs 110A-E.

An example process 1000 implementable by hardware operations, machine readable instructions, and/or a combination thereof, which may be executed by the example processor-based system 100 to migrate stored data from an example transient-permanent information storage architecture in the system 100 to persistent memory in the system 100 is illustrated in FIG. 10. With reference to the preceding figures and associated written descriptions, the example process 1000 of FIG. 10 begins execution at block 1005 at which the example BIOS 145 (or the system OS) sends a mailbox command to the example memory controller 115 to instruct the memory controller 115 to copy data stored in the transient-permanent information storage architecture provided by the reserved regions 210A-E of the non-volatile DIMMs 110A-E to a starting persistent memory address, such as a starting logical address mapped to a location in the visible regions 205A-E of the non-volatile DIMMs 110A-E. At block 1010, the memory controller 115 converts the starting persistent memory address provided by the BIOS 145 (or OS) to a starting physical device address, such as a corresponding physical address of the location in the visible regions 205A-E of the non-volatile DIMMs 110A-E. After performing the address conversion, the memory controller also initiates a DMA copy of the data from the transient-permanent information storage architecture provided by the reserved regions 210A-E to the starting physical address of the persistent memory.

At block 1015, a DMA engine of the example processor-based system 100 then begins copying the contents of the transient-permanent information storage architecture provided by the reserved regions 210A-E to the starting physical address of the persistent memory. When the DMA copy is complete (block 1020), the memory controller 115 completes the mailbox command (block 1025), thereby indicating the DMA transfer is complete. At block 1030, the BIOS 145 (or OS) is now able to access the copy of the migrated data that is now stored in the persistent memory (and which is visible to the system 100 via, for example, a host memory map).

Figure 11:
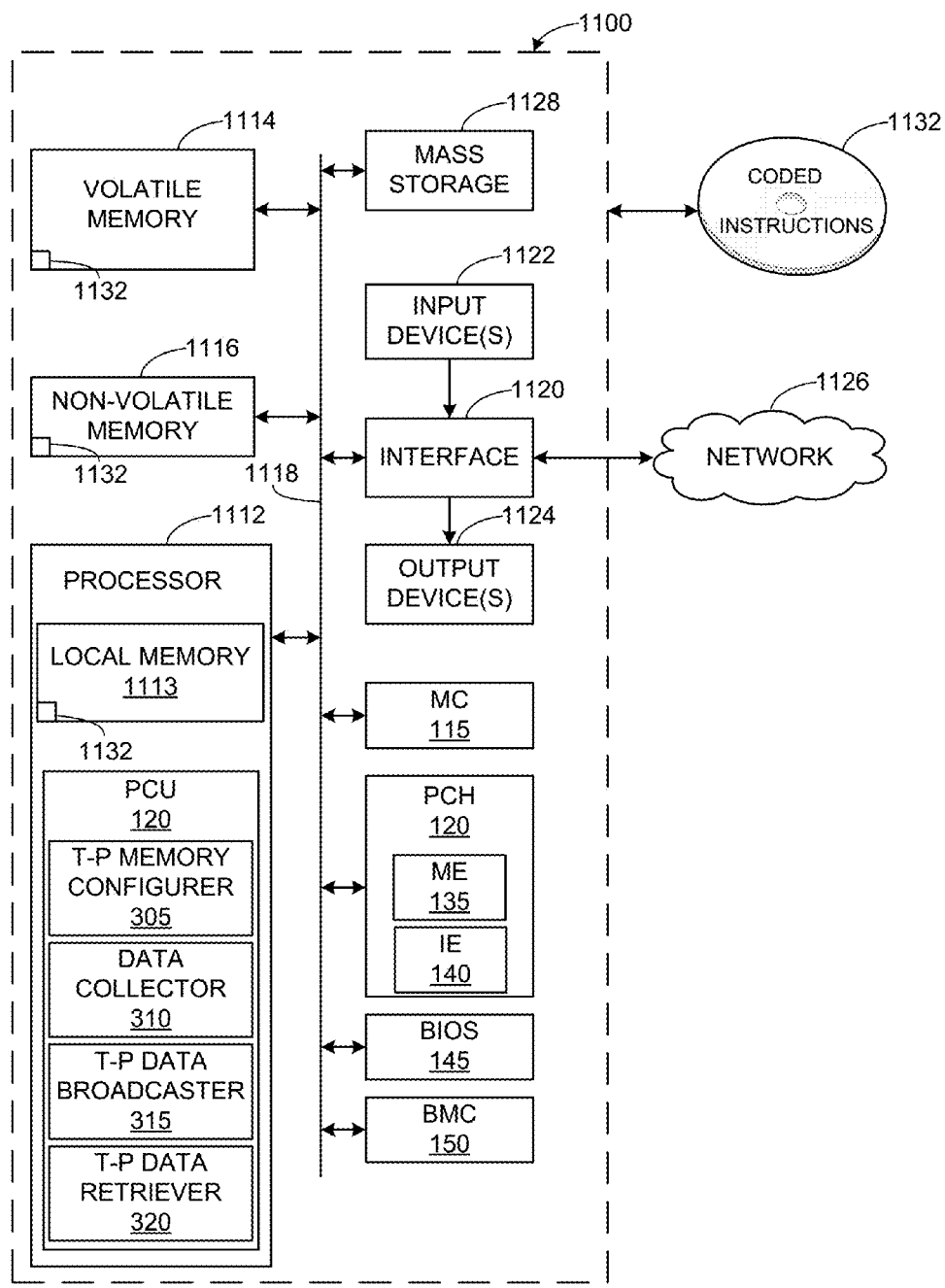
FIG. 11 is a block diagram of an example processor platform structured to execute the example machine readable instructions of FIGS. 6-9 and/or 10 to implement the example processor-based system of FIG. 1.

FIG. 11 is a block diagram of an example processor platform 1100 capable of executing the instructions of FIGS. 6-10 to implement the example processor-based system 100 of FIGS. 1-5. The processor platform 1100 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, or any other type of computing device.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer. In the illustrated example of FIG. 11, the processor 1512 implements the example CPU(s) 105. Furthermore, the processor 1512 is configured via example instructions 1532, which include one or more the example instructions of FIGS. 6-10, to implement the example PCU 120, the example transient-permanent memory configurer 305, the example data collector 310, the example data broadcaster 315 and/or the example data retriever 320 of FIG. 3.

The processor 1112 of the illustrated example includes a local memory 1113 (e.g., a cache). The processor 1112 of the illustrated example is in communication with a main memory including a volatile memory 1114 and a non-volatile memory 1116 via a link 1118. The link 1118 may be implemented by a bus, one or more point-to-point connections, etc., or a combination thereof. The volatile memory 1114 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1116 may be implemented by the example non-volatile memory modules 110A-E, and/or by flash memory and/or any other desired type of memory device. Access to the main memory 1114, 1116 is controlled by a memory controller, such as the example memory controller 115.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and commands into the processor 1112. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 1100, can allow the user to control the computer system and provide data to the computer using physical gestures, such as, but not limited to, hand or body movements, facial expressions, and face recognition.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID (redundant array of independent disks) systems, and digital versatile disk (DVD) drives.

The processor platform 1100 of the illustrated example further includes the example PCH 125, which also implements the example ME 135 and the example IE 140, as described above. The processor platform 1100 of the illustrated example also includes the example BIOS 145 and the BMC 150, which are described above.

Coded instructions 1132 corresponding to the instructions of FIGS. 6-9 and/or 10 may be stored in the mass storage device 1128, in the volatile memory 1114, in the non-volatile memory 1116, in the local memory 1113 and/or on a removable tangible computer readable storage medium, such as a CD or DVD 1136.

The following further examples, which include subject matter such as a method utilize non-volatile memory for information storage, means for utilizing non-volatile memory for information storage, at least one computer-readable medium including instructions that, when executed by a processor, cause the processor to utilize non-volatile memory for information storage, and an apparatus and/or a system for utilizing non-volatile memory for information storage are disclosed herein.

Example 1 is a method to utilize non-volatile memory for information storage, the method including accessing, with a power control unit associated with a processor, first information describing available capacities of respective reserved regions of a plurality of non-volatile memory modules, the respective reserved regions of the non-volatile memory modules being separate from respective host-visible regions of the non-volatile memory modules. The method of example 1 also includes configuring, with the power control unit, an information storage architecture based on the first information. The method of example 1 further includes storing, with the power control unit, second information in one or more of the respective reserved regions of the non-volatile memory modules in accordance with the information storage architecture.

Example 2 includes the subject matter of example 1, wherein the accessing of the first information includes receiving, via a system bus, a message including the first information from a memory controller controlling access to the non-volatile memory modules.

Example 2 includes the subject matter of example 1 or example 2, wherein the first information includes respective locations and sizes for the respective reserved regions of the non-volatile memory modules, and the configuring of the information storage architecture includes storing the respective locations and sizes for the respective reserved regions of the non-volatile memory modules.

Example 4 includes the subject matter of example 3, wherein the configuring of the information storage architecture further includes using the respective locations and sizes for the respective reserved regions of the non-volatile memory modules to arrange the respective reserved regions of the non-volatile memory modules logically to implement data redundancy.

Example 5 includes the subject matter of any one of examples 1 to 4, wherein the storing of the second information is in response to an error condition. Example 5 further includes collecting, with the power control unit, the second information, and broadcasting, with the power control unit, the second information to the one or more of the respective reserved regions of the non-volatile memory modules via messages transmitted over a system bus.

Example 6 includes the subject matter of any one of examples 1 to 5, and further includes restarting a host system including the processor after the storing of the second information, and after the restarting of the host system, retrieving the second information from the one or more of the respective reserved regions of the non-volatile memory modules.

Example 7 includes the subject matter of any one of examples 1 to 6, wherein the non-volatile memory modules are implemented by non-volatile phase change memory modules.

Example 8 is a tangible computer readable storage medium including computer readable instructions which, when executed, cause a processor to at least (1) access first information describing available capacities of respective reserved regions of a plurality of non-volatile memory modules, the respective reserved regions of the non-volatile memory modules being separate from respective host-visible regions of the non-volatile memory modules, (2) configure an information storage architecture based on the first information, and (3) store second information in one or more of the respective reserved regions of the non-volatile memory modules in accordance with the information storage architecture.

Example 9 includes the subject matter of example 8, wherein to access the first information, the instructions, when executed, cause the processor to receive, via a system bus, a message including the first information from a memory controller controlling access to the non-volatile memory modules.

Example 10 includes the subject matter of example 8 or example 9, wherein the first information includes respective locations and sizes for the respective reserved regions of the non-volatile memory modules, and to configure the information storage architecture, the instructions, when executed, cause the processor to store the respective locations and sizes for the respective reserved regions of the non-volatile memory modules.

Example 11 includes the subject matter of example 10, wherein to configure the information storage architecture, the instructions, when executed, further cause the processor to use the respective locations and sizes for the respective reserved regions of the non-volatile memory modules to arrange the respective reserved regions of the non-volatile memory modules logically to implement data redundancy.

Example 12 includes the subject matter of any one of examples 8 to 11, wherein the instructions, when executed, cause the processor to store the second information in response to an error condition, and to store the second information, the instructions, when executed, further cause the processor to collect the second information, and broadcast the second information to the one or more of the respective reserved regions of the non-volatile memory modules via messages transmitted over a system bus.

Example 13 includes the subject matter of any one of examples 8 to 12, wherein the instructions, when executed, further cause the processor to restart a host system after the storing of the second information, and after the host system is restarted, retrieve the second information from the one or more of the respective reserved regions of the non-volatile memory modules.

Example 14 includes the subject matter of any one of examples 8 to 13, wherein the non-volatile memory modules are implemented by non-volatile phase change memory modules.

Example 15 is a tangible computer readable storage medium including computer readable instructions which, when executed, cause a processor to perform the method of any one of examples 1 to 7.

Example 16 is a power control unit including a memory configurer to (1) access first information describing available capacities of respective reserved regions of a plurality of non-volatile memory modules, the respective reserved regions of the non-volatile memory modules being separate from respective host-visible regions of the non-volatile memory modules, and (2) configure an information storage architecture based on the first information. The power control unit of example 16 also includes a data broadcaster to store second information in one or more of the respective reserved regions of the non-volatile memory modules in accordance with the information storage architecture.

Example 17 includes the subject matter of example 16, wherein to access the first information, the memory configurer is to receive, via a system bus, a message including the first information from a memory controller controlling access to the non-volatile memory modules.

Example 18 includes the subject matter of example 16 or example 17, wherein the first information includes respective locations and sizes for the respective reserved regions of the non-volatile memory modules, and to configure the information storage architecture, the memory configurer is to store the respective locations and sizes for the respective reserved regions of the non-volatile memory modules.

Example 19 includes the subject matter of example 18, wherein to configure the information storage architecture, the memory configurer is further to use the respective locations and sizes for the respective reserved regions of the non-volatile memory modules to arrange the respective reserved regions of the non-volatile memory modules logically to implement data redundancy.

Example 20 includes the subject matter of any one of examples 16 to 19, and further includes a data collector to collect the second information, and the data broadcaster is further to broadcast the second information to the one or more of the respective reserved regions of the non-volatile memory modules via messages transmitted over a system bus.

Example 21 includes the subject matter of any one of examples 16 to 20, wherein the data broadcaster is to store the second information in response to an error condition, and the power control unit is to restart a host system after the data broadcaster stores the second information.

Example 22 is a power control unit configured to perform the method of any one of examples 1 to 7.

Example 23 is a power control unit including means for accessing first information describing available capacities of respective reserved regions of a plurality of non-volatile memory modules, the respective reserved regions of the non-volatile memory modules being separate from respective host-visible regions of the non-volatile memory modules. The power control unit of example 23 also includes means for configuring an information storage architecture based on the first information. The power control unit of example 23 further includes means for storing, second information in one or more of the respective reserved regions of the non-volatile memory modules in accordance with the information storage architecture.

Example 24 includes the subject matter of example 23, wherein the means for accessing the first information includes means for receiving, via a system bus, a message including the first information from a memory controller controlling access to the non-volatile memory modules.

Example 25 includes the subject matter of example 23 or example 24, wherein the first information includes respective locations and sizes for the respective reserved regions of the non-volatile memory modules, and the means for configuring the information storage architecture includes means for storing the respective locations and sizes for the respective reserved regions of the non-volatile memory modules.

Example 26 includes the subject matter of example 25, wherein the means for configuring the information storage architecture further includes means for using the respective locations and sizes for the respective reserved regions of the non-volatile memory modules to arrange the respective reserved regions of the non-volatile memory modules logically to implement data redundancy.

Example 27 includes the subject matter of any one of examples 23 to 26, wherein the means for storing the second information operate in response to an error condition. Example 27 further includes means for collecting the second information, and means for broadcasting the second information to the one or more of the respective reserved regions of the non-volatile memory modules via messages transmitted over a system bus.

Example 28 includes the subject matter of any one of examples 23 to 27, and further includes means for restarting a host system after the storing of the second information, and means for retrieving the second information from the one or more of the respective reserved regions of the non-volatile memory modules after the restarting of the host system.

Example 29 is a processor-based system including a processor and a plurality of non-volatile memory modules having respective reserved regions and respective host-visible regions, the respective reserved regions being separate from the respective host-visible regions of the non-volatile memory modules. The processor-based system of example 29 also includes a power control unit to (1) access first information describing available capacities of the respective reserved regions of the non-volatile memory modules, (2) configure an information storage architecture based on the first information, and (3) store second information in one or more of the respective reserved regions of the non-volatile memory modules in accordance with the information storage architecture.

Example 30 includes the subject matter of example 29, and further includes a memory controller to control access to the non-volatile memory modules, and wherein to access the first information, the power control unit is to receive, via a system bus, a message including the first information from the memory controller.

Example 31 includes the subject matter of example 29 or example 30, wherein the first information includes respective locations and sizes for the respective reserved regions of the non-volatile memory modules, and to configure the information storage architecture, the power control unit is to store the respective locations and sizes for the respective reserved regions of the non-volatile memory modules.

Example 32 includes the subject matter of example 31, wherein to configure the information storage architecture, the power control unit is further to use the respective locations and sizes for the respective reserved regions of the non-volatile memory modules to arrange the respective reserved regions of the non-volatile memory modules logically to implement data redundancy.

Example 33 includes the subject matter of any one of examples 29 to 32, wherein the power control unit is to store the second information in response to an error condition, and to store the second information, the power control unit is further to (1) collect the second information, and (2) broadcast the second information to the one or more of the respective reserved regions of the non-volatile memory modules via messages transmitted over a system bus.

Example 34 includes the subject matter of any one of examples 29 to 33, wherein the power control unit is further to restart the processor-based system after the second information is stored, and retrieve the second information from the one or more of the respective reserved regions of the non-volatile memory modules after the processor-based system is restarted.

Example 35 includes the subject matter of any one of examples 29 to 34, wherein the non-volatile memory modules are implemented by non-volatile phase change memory modules.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method to utilize non-volatile memory for information storage, the method comprising:
   accessing, with a power control unit associated with a processor, first information describing available capacities of respective reserved regions of a plurality of non-volatile memory modules, the respective reserved regions of the non-volatile memory modules being separate from respective host-visible regions of the non-volatile memory modules; and
   configuring, with the power control unit, an information storage architecture based on the first information; and
   storing, before a restart of a host system and with the power control unit, second information in one or more of the respective reserved regions of the non-volatile memory modules in accordance with the information storage architecture, the storing of the second information to prevent loss of the second information during the restart of the host system, the storing of the information in the respective reserved regions separate from the respective host-visible regions to prevent the second information from corrupting host-visible data storage regions, the host system including the processor.

2. The method of claim 1, wherein the accessing of the first information includes receiving, via a system bus, a message including the first information from a memory controller controlling access to the non-volatile memory modules.

3. The method of claim 1, wherein the first information includes respective locations and sizes for the respective reserved regions of the non-volatile memory modules, and the configuring of the information storage architecture includes storing the respective locations and sizes for the respective reserved regions of the non-volatile memory modules.

4. The method of claim 3, wherein the configuring of the information storage architecture further includes using the respective locations and sizes for the respective reserved regions of the non-volatile memory modules to arrange the respective reserved regions of the non-volatile memory modules logically to implement data redundancy.

5. The method of claim 1, wherein the storing of the second information is in response to an error condition, and further includes:
 collecting, with the power control unit, the second information; and
 broadcasting, with the power control unit, the second information to the one or more of the respective reserved regions of the non-volatile memory modules via messages transmitted over a system bus.

6. The method of claim 1, further including:
 restarting the host system including the processor after the storing of the second information; and
 after the restarting of the host system, retrieving the second information from the one or more of the respective reserved regions of the non-volatile memory modules.

7. A tangible computer readable storage medium comprising computer readable instructions which, when executed, cause a processor to at least:
 access first information describing available capacities of respective reserved regions of a plurality of non-volatile memory modules, the respective reserved regions of the non-volatile memory modules being separate from respective host-visible regions of the non-volatile memory modules;
 configure an information storage architecture based on the first information; and
 store second information in one or more of the respective reserved regions of the non-volatile memory modules in accordance with the information storage architecture, the second information stored to prevent loss of the second information during a subsequent restart of a host system, the second information stored in the respective reserved regions separate from the respective host-visible regions to prevent the second information from corrupting host-visible data storage regions, the host system including the processor.

8. The storage medium of claim 7, wherein to access the first information, the instructions, when executed, cause the processor to receive, via a system bus, a message including the first information from a memory controller controlling access to the non-volatile memory modules.

9. The storage medium of claim 7, wherein the first information includes respective locations and sizes for the respective reserved regions of the non-volatile memory modules, and to configure the information storage architecture, the instructions, when executed, cause the processor to store the respective locations and sizes for the respective reserved regions of the non-volatile memory modules.

10. The storage medium of claim 9, wherein to configure the information storage architecture, the instructions, when executed, further cause the processor to use the respective locations and sizes for the respective reserved regions of the non-volatile memory modules to arrange the respective reserved regions of the non-volatile memory modules logically to implement data redundancy.

11. The storage medium of claim 7, wherein the storing of the second information in response to an error condition, and-to store the second information, the instructions, when executed, further cause the processor to: collect the second information; and broadcast the second information to the one or more of the respective reserved regions of the non-volatile memory modules via messages transmitted over a system bus.

12. The storage medium of claim 7, wherein the instructions, when executed, further cause the processor to:
 restart the host system after the storing of the second information; and
 after the host system is restarted, retrieve the second information from the one or more of the respective reserved regions of the non-volatile memory modules.

13. A power control unit comprising:
 a memory configurer to:
  access first information describing available capacities of respective reserved regions of a plurality of non-volatile memory modules, the respective reserved regions of the non-volatile memory modules being separate from respective host-visible regions of the non-volatile memory modules; and
  configure an information storage architecture based on the first information;
 a data collector to collect, before a restart of a host system, second information including crash dump data associated with an error condition, the host system including a processor associated with the power control unit; and
 a data broadcaster to store second information in one or more of the respective reserved regions of the non-volatile memory modules in accordance with the information storage architecture, the second information stored to prevent loss of the second information during a subsequent restart of the host system, the second information stored in the respective reserved regions separate from the respective host-visible regions to prevent the crash dump data from corrupting host-visible data storage regions.

14. The power control unit of claim 13, wherein to access the first information, the memory configurer is to receive, via a system bus, a message including the first information from a memory controller controlling access to the non-volatile memory modules.

15. The power control unit of claim 13, wherein the first information includes respective locations and sizes for the respective reserved regions of the non-volatile memory modules, and to configure the information storage architecture, the memory configurer is to store the respective locations and sizes for the respective reserved regions of the non-volatile memory modules.

16. The power control unit of claim 15, wherein to configure the information storage architecture, the memory configurer is further to use the respective locations and sizes for the respective reserved regions of the non-volatile memory modules to arrange the respective reserved regions of the non-volatile memory modules logically to implement data redundancy.

17. The power control unit of claim 13, wherein the data broadcaster is further to broadcast the second information to the one or more of the respective reserved regions of the non-volatile memory modules via messages transmitted over a system bus.

18. The power control unit of claim 13, wherein the power control unit is further to restart the host system after the data broadcaster stores the second information.

19. A processor-based system comprising:
a processor;
a plurality of non-volatile memory modules having respective reserved regions and respective host-visible regions, the respective reserved regions being separate from the respective host-visible regions of the non-volatile memory modules; and
a power control unit to:
  access first information describing available capacities of the respective reserved regions of the non-volatile memory modules;
  configure an information storage architecture based on the first information; and
  store, in response to an error condition, second information in one or more of the respective reserved regions of the non-volatile memory modules in accordance with the information storage architecture, the second information stored to prevent loss of the second information during a subsequent restart of the processor-based system, the second information stored in the respective reserved regions separate from the respective host-visible regions to prevent the second information from corrupting host-visible data storage regions, the host system including the processor.

20. The system of claim 19, further including a memory controller to control access to the non-volatile memory modules, and wherein to access the first information, the power control unit is to receive, via a system bus, a message including the first information from the memory controller.

21. The system of claim 19, wherein the first information includes respective locations and sizes for the respective reserved regions of the non-volatile memory modules, and to configure the information storage architecture, the power control unit is to store the respective locations and sizes for the respective reserved regions of the non-volatile memory modules.

22. The system of claim 21, wherein to configure the information storage architecture, the power control unit is further to use the respective locations and sizes for the respective reserved regions of the non-volatile memory modules to arrange the respective reserved regions of the non-volatile memory modules logically to implement data redundancy.

23. The system of claim 19, wherein the power control unit is further to:
  collect the second information; and
  broadcast the second information to the one or more of the respective reserved regions of the non-volatile memory modules via messages transmitted over a system bus.

24. The system of claim 19, wherein the power control unit is further to:
  restart the processor-based system after the second information is stored; and
  after the processor-based system is restarted, retrieve the second information from the one or more of the respective reserved regions of the non-volatile memory modules.

25. The system of claim 19, wherein the non-volatile memory modules are implemented by non-volatile phase change memory modules.

* * * * *